United States Patent [19]

Lucek et al.

[11] Patent Number: 5,045,909
[45] Date of Patent: Sep. 3, 1991

[54] POWER SWITCHING SEMICONDUCTOR DEVICE

[75] Inventors: John Z. Lucek; Roger H. Moult, both of Birmingham, England

[73] Assignee: Lucas Industries public limited company, Birmingham, England

[21] Appl. No.: 541,899

[22] Filed: Jun. 21, 1990

[30] Foreign Application Priority Data

Jun. 24, 1989 [GB] United Kingdom ............... 8914554

[51] Int. Cl.$^5$ .................... H01L 29/72; H01L 29/10; H01L 29/747; H01L 27/02
[52] U.S. Cl. ................................... 357/34; 357/23.4; 357/39; 357/43; 357/35
[58] Field of Search ................ 357/34, 39, 43, 23.4

[56] References Cited

U.S. PATENT DOCUMENTS

| 4,612,562 | 9/1986 | Motojima et al. | 357/39 |
| 4,786,961 | 11/1988 | Avery | 357/34 |
| 4,791,470 | 12/1988 | Shinohe et al. | 357/39 |
| 4,800,416 | 1/1989 | Musemeci | 357/34 |
| 4,903,106 | 2/1990 | Fukunaga et al. | 357/34 |
| 4,954,865 | 9/1990 | Rokos | 357/34 |

FOREIGN PATENT DOCUMENTS 1396896 6/1975 United Kingdom .

Primary Examiner—Andrew J. James
Assistant Examiner—Cynthia S. Deal
Attorney, Agent, or Firm—Nixon & Vanderhye

[57] ABSTRACT

A semiconductor power switching device has an insulated gate which establishes charge carrier flow between an additional terminal and a base region to provide current flow through the device between collector and emitter terminals. The device in effect comprises a bipolar transistor with an integral MOSFET for driving its base, so that a small signal applied to the gate drives the bipolar transistor into saturation. In use the collector is connected to a supply rail through a load and the additional terminal is connected directly or indirectly to the same rail.

12 Claims, 6 Drawing Sheets

POWER SWITCHING SEMICONDUCTOR DEVICE

BACKGROUND OF THE INVENTION

1. Field of the Invention

This invention relates to a semiconductor device and more particularly to a power switching device which exhibits a low on-state voltage drop.

2. Discussion of Prior Art

The bipolar transistor exhibits a low forward or on-state voltage drop when it is driven into saturation, but it requires a relatively high power drive. MOSFET devices require a low power drive but exhibit a relatively high on-state voltage drop. An insulated gate bipolar transistor (IGBT) exhibits a relatively high on-state voltage drop although it requires a relatively low power drive, but it is susceptible to latching in the on-state such that it cannot be switched off by gate control.

SUMMARY OF THE INVENTION

We have now devised a semiconductor power switching device which exhibits a low on-state voltage drop and requires a low power drive, and avoids the latch-up problem of IGBT devices.

In accordance with this invention, there is provided a semiconductor device comprising a body of semiconductor material having a collector region of a first conductivity type, an emitter region of the first conductivity type, and a base region of a second conductivity type disposed between the emitter and collector regions, a first terminal connected to the collector region, a second terminal connected to the emitter region, an insulated gate applied to a surface of the semiconductor body, a third terminal connected to the gate, and a fourth terminal, the insulated gate serving to establish a charge carrier flow to the base region from the fourth terminal and so provide current flow through the device between the first and second terminals.

This device in effect comprises a bipolar transistor having an integral MOSFET device for driving its base. A small drive signal applied to the gate terminal enables a charge carrier flow from the fourth terminal to the base region of the bipolar transistor, such as to drive the bipolar transistor into saturation. In this state, the bipolar transistor exhibits a low forward voltage drop.

The device in accordance with this invention is primarily a four terminal device. In use, the load is connected in the collector circuit of the device and the fourth terminal is connected directly or indirectly to the same rail as the load (preferably ground), ensuring that a large drive will flow to the base of the bipolar transistor to drive it into saturation.

In one embodiment of the invention, the insulated gate overlies a portion of the base region which is brought to the surface of the body of semiconductor material, and establishes charge carrier flow between two further regions (source and drain of the MOSFET) which are formed in the base region. The fourth terminal is connected to one of these further regions (the drain) and a surface conductor connects the other of these further regions (the source) to the base region. Charge carrier flow is thus established (in the on-state) from the fourth terminal and through the base region below the gate electrode from the drain region to the source region and then through the surface conductor and into the base region of the bipolar transistor.

In another embodiment, the insulated gate overlies a portion of the base region which is brought to the surface of the body of semiconductor material, and establishes charge carrier flow between a portion of the collector region (acting as drain) and a further region (source) which is formed in the base region. The fourth terminal is connected to the drain portion of the collector region and a surface conductor connects the source region to the base region. Charge carrier flow is thus established (in the on-state) from the fourth terminal and through the base region below the gate electrode from the drain to the source and then through the surface conductor and into the base region of the bipolar transistor.

In a further embodiment, the insulated gate overlies a portion of the collector region between the base region and a further region formed in the collector region and to which the fourth terminal is connected. Charge carrier flow is established (in the on-state) from the fourth terminal and through the adjacent portion of the collector region from the further region and directly into the base region.

In a yet further embodiment, the device comprises a second region of the same conductivity type as the base region, extending to the surface of the device but separated from the base region. The insulated gate overlies this second region and establishes charge carrier flow between two further regions which are formed in this second region. One of these further regions is connected to the fourth terminal and the other of these further regionss is connected to the base region by a surface conductor. This arrangement protects the device in the event that the emitter terminal and fourth terminals are inadvertently connected to receive supply voltages of incorrect polarity relative to each other.

In a modification, a portion of the base region may extend to the emitter terminal. This deliberate short circuit takes full load current from the collector terminal should the supply be connected with incorrect polarity, load then limiting the current flow.

BRIEF DESCRIPTION OF THE DRAWINGS

Embodiments of this invention will now be described by way of examples only and with reference to the accompanying drawings, in which.

DETAILED DESCRIPTION OF PREFERRED EMBODIMENT

Figure 1:
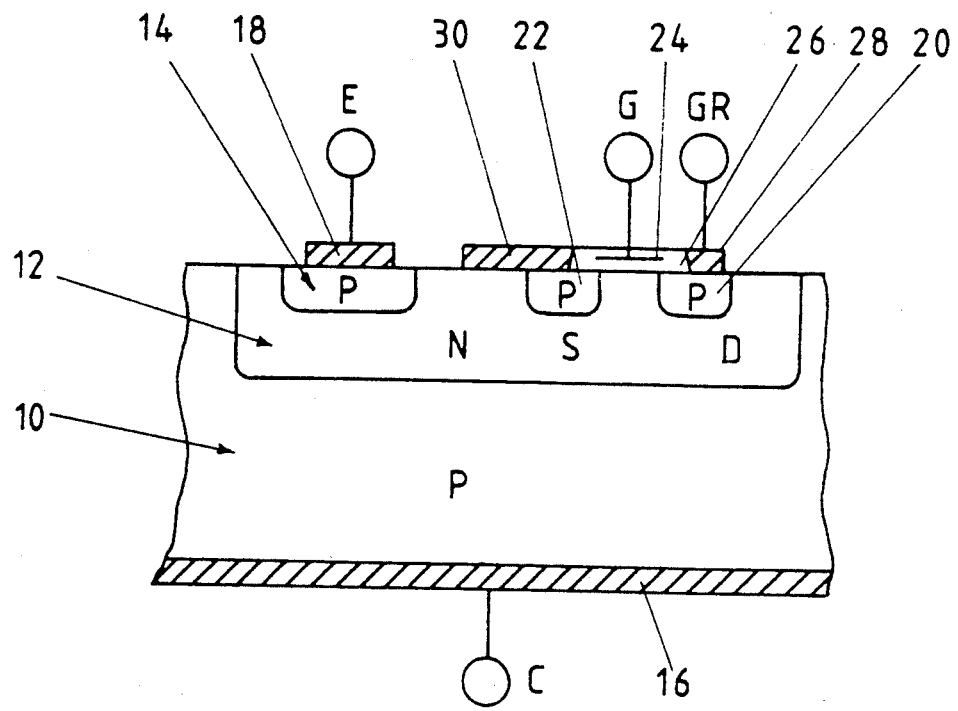
FIG. 1 is a diagrammatic section through one embodiment of semiconductor power switching device in accordance with this invention.

Referring to FIG. 1 of the drawings, there is shown a semiconductor power switching device which comprises a body of semiconductor material having a p-type substrate 10 forming the collector region, into which an n-type base region 12 is diffused from one surface, which base region has a p-type emitter region 14 diffused into it. An electrode 16 is formed over the other surface of the substrate and a first terminal C is connected to this. An electrode 18 is formed over the surface of the emitter region and a second terminal E is connected to this. The base region 12 extends along the surface of the device away from the emitter region and two further p-type regions 20, 22 (drain and source regions) are diffused into this base region. A gate electrode 24 is applied to the same surface of the device over the portion of base region between the p-type drain and source regions 20, 22, but the gate electrode 24 is insulated from the device by an insulating layer 26. A third terminal G is connected to the gate electrode 24. A fourth terminal GR is connected to an electrode 28 which is applied over the p-type region 20. Metallization 30 extends over the surface of the device from the p-type source region 22 to the base region 12.

The device shown in FIG. 1 is thus a four terminal device (i.e. it has four external terminals E, C, G, GR). It comprises a vertical bipolar pnp transistor formed by the three layers of alternate conductivity-type 10, 12, 14 disposed between electrodes 16, 18 on opposite surfaces of the body of semiconductor material and an integral MOSFET device on the surface for establishing drive to the base region of the bipolar transistor.

Figure 2:
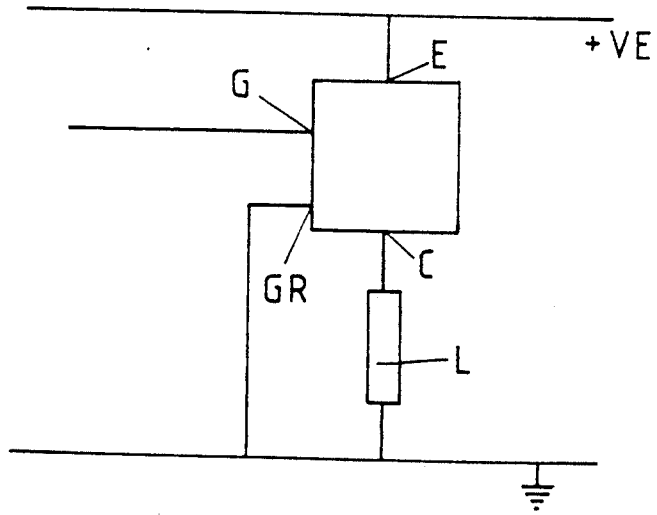
FIG. 2 is a schematic circuit diagram showing use of the device of FIG. 1.

The device of FIG. 1 is shown in FIG. 2 as a high side switch. The emitter terminal E of the device is connected to the +ve supply rail and the collector terminal C is connected through the load L to ground. The terminal GR of the device is connected directly to ground. The device is switched on by applying a -ve drive signal to the gate terminal G. This creates a p-channel through the base region 12 between the p-type drain and source regions 20, 22. Charge carriers then flow out of the base region, through the metallization 30 to source region 22, through the p-type channel to drain region 20 and to terminal GR, with the effect of driving the bipolar transistor into saturation. Only a small drive signal is needed on the gate G to drive the bipolar transistor into saturation and, when switched on, the device exhibits a low forward or on-state voltage.

Figure 3:
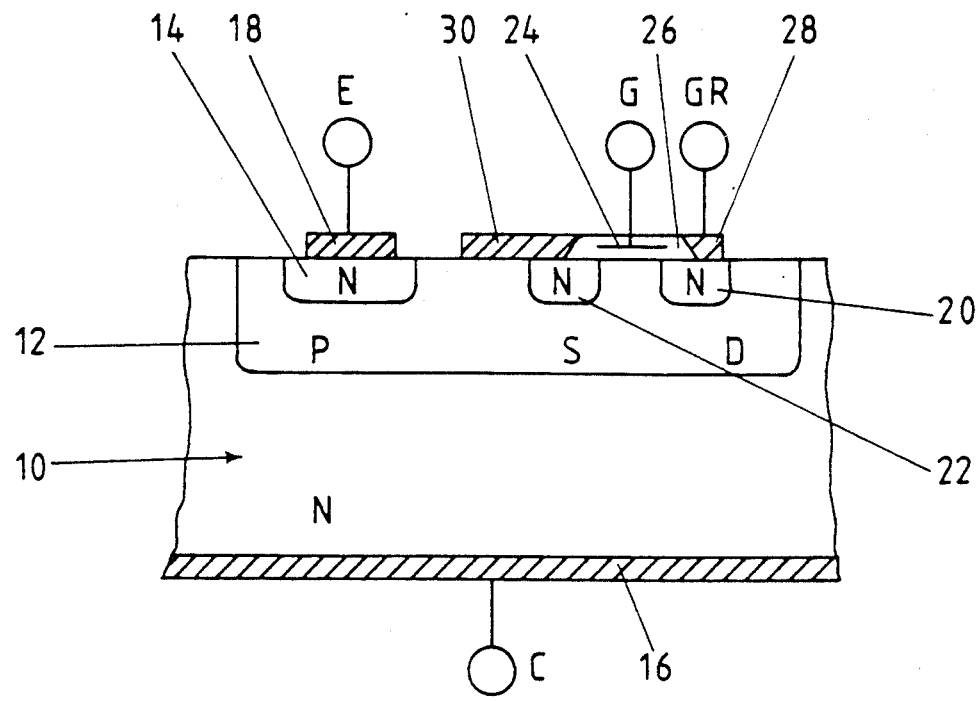
FIG. 3 is a diagrammatic section through a complementary version of the device of FIG. 1.
Figure 4:
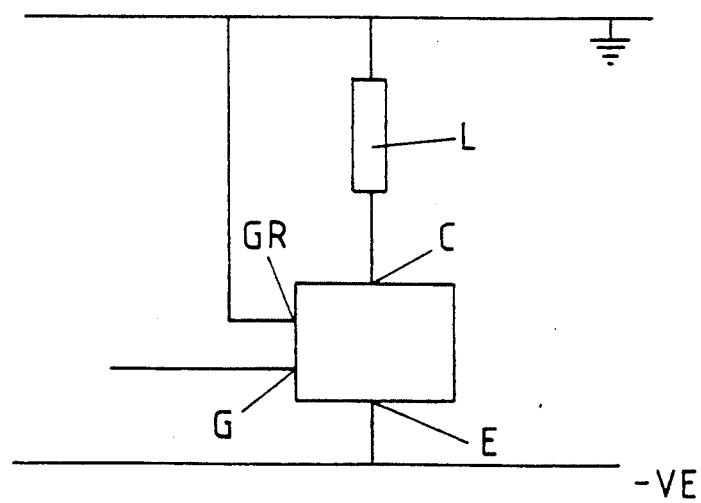
FIG. 4 is a schematic circuit diagram showing use of the device of FIG. 3.

FIG. 3 shows an equivalent device to that of FIG. 1, but of the complementary conductivity type. Thus the bipolar transistor is an npn device and the drain and source regions 20, 22 diffused into the base region 12 are n-type. The device is shown in FIG. 4 as a low side switch, the emitter terminal E being connected to a −ve supply rail, collector terminal C being connected to ground via the load L and the terminal GR being connected directly to ground. The device is switched on by applying a +ve drive signal to the gate terminal G.

Figure 5:
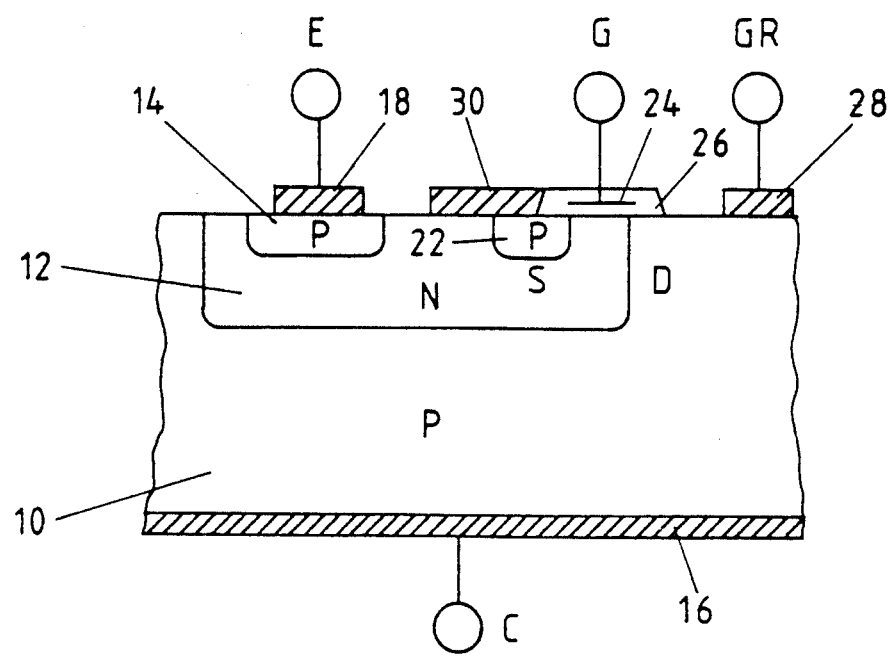
FIG. 5 is a diagrammatic section through another embodiment of semiconductor power switching device in accordance with this invention.

FIG. 5 shows a modification of the device of FIG. 1, in which the electrode 28 of the fourth terminal is applied to a portion of the substrate 10 at the top surface of the device. A drive signal applied to the gate creates a p-channel through the base region between this portion of the substrate (acting as a drain region) and the source region 22. Charge carriers flow from the base region, through metallization 30 to source region 22 as in the device of FIG. 1, then through the p-channel to the adjacent drain portion of the substrate and to the electrode 28. This drives the bipolar transistor into saturation, as in the device of FIG. 1. The device of FIG. 5 requires high resistivity semiconductor material or an external resistor in order to avoid the main current diverting to the electrode 28 and terminal GR.

Figure 6:
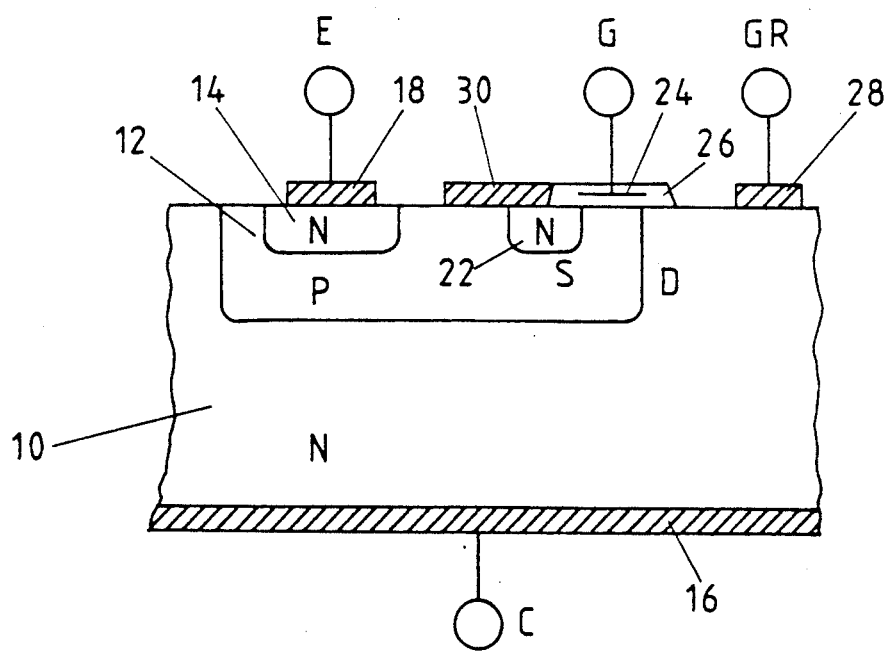
FIG. 6 is a diagrammatic section through a complementary version of the device of FIG. 5.

FIG. 6 shows an equivalent device to that of FIG. 5, but of complementary conductivity type and useful as a low side switch (as in FIG. 4) rather than as a high side switch.

Figure 7:
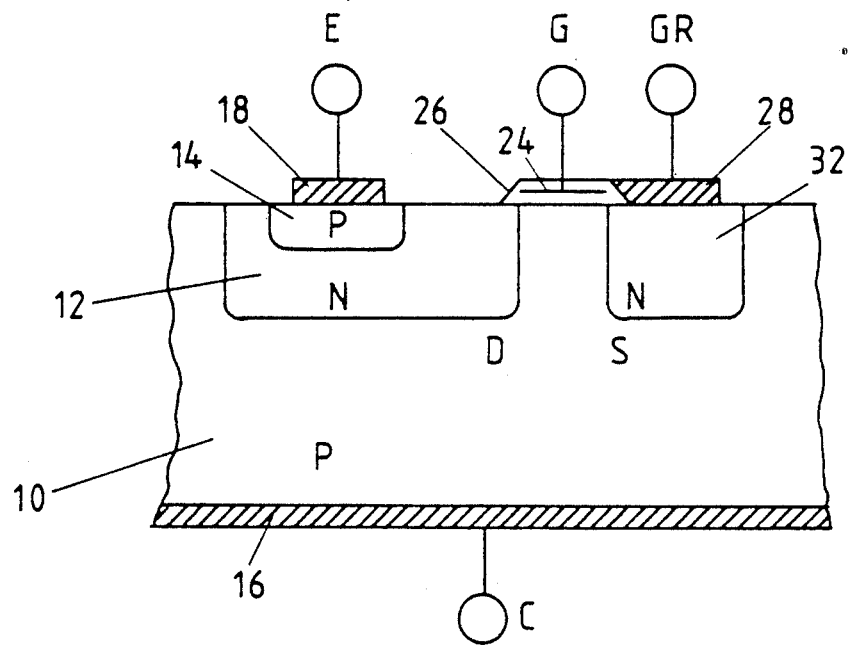
FIG. 7 is a diagrammatic section through a further embodiment of semiconductor power switching device in accordance with this invention.

FIG. 7 shows a further embodiment of semiconductor power switching device with a pnp bipolar transistor and having an n-type region 32 diffused into the substrate 10 at the top surface of the device, adjacent but separated from the base region 12. The gate electrode 24 overlies the substrate 10 between the base region and n-type region 32. In use when a +ve drive signal is applied to the gate, an n-channel is formed through the substrate 10 between the base region 12 (acting as drain) and n-type region 32 (acting as source): electrons flow from the terminal GR into the region 32, through the n-channel and directly into the base to drive the bipolar transistor into saturation. The device however requires a resistor R between the electrodes 28 and ground, which resistor may be external of the device (FIG. 8).

Figure 8:
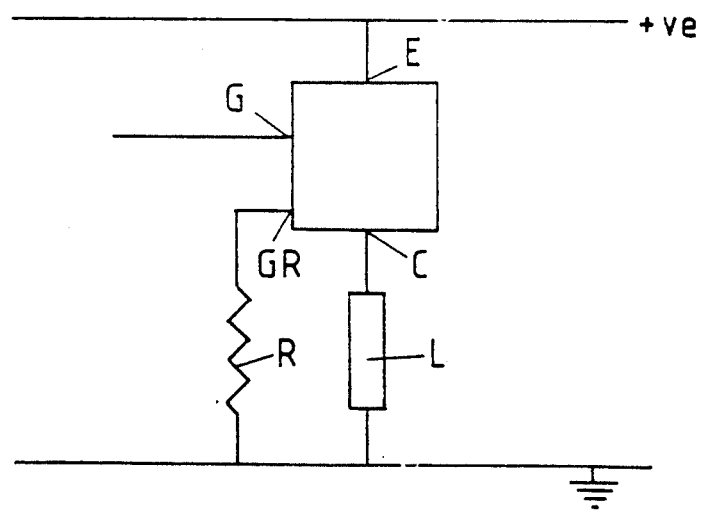
FIG. 8 is a schematic circuit diagram showing use of the device of FIG. 7.
Figure 9:
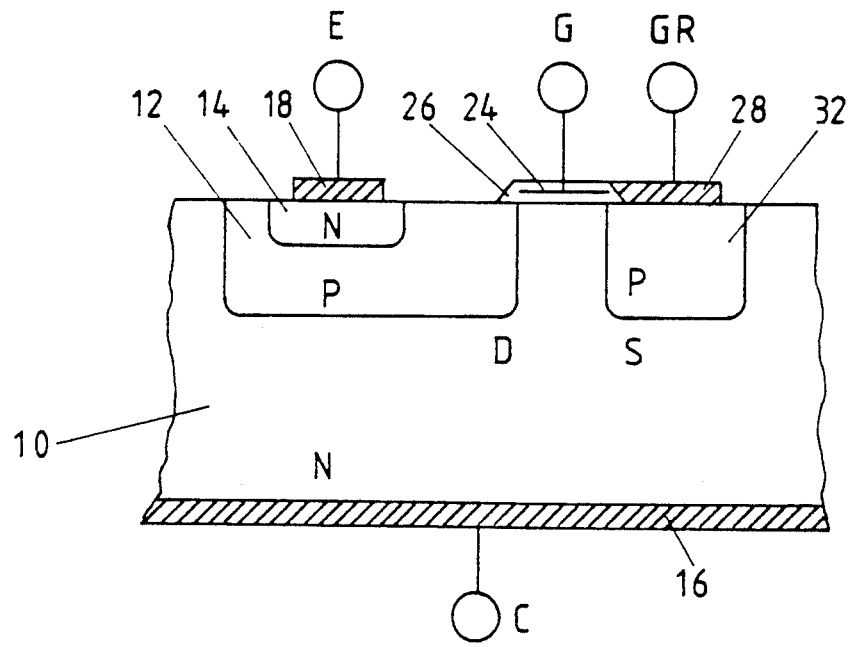
FIG. 9 is a diagrammatic section through a complementary version of the device of FIG. 7.
Figure 10:
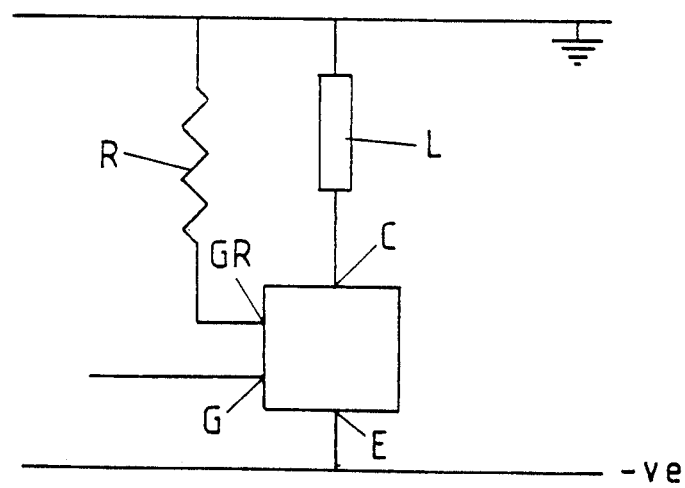
FIG. 10 is a schematic circuit diagram showing use of the device of FIG. 9.

FIG. 9 shows an equivalent device to that of FIG. 7, but of complementary conductivity type and useful (FIG. 10) as a low side switch instead of the high side switch shown in FIG. 8.

Figure 11:
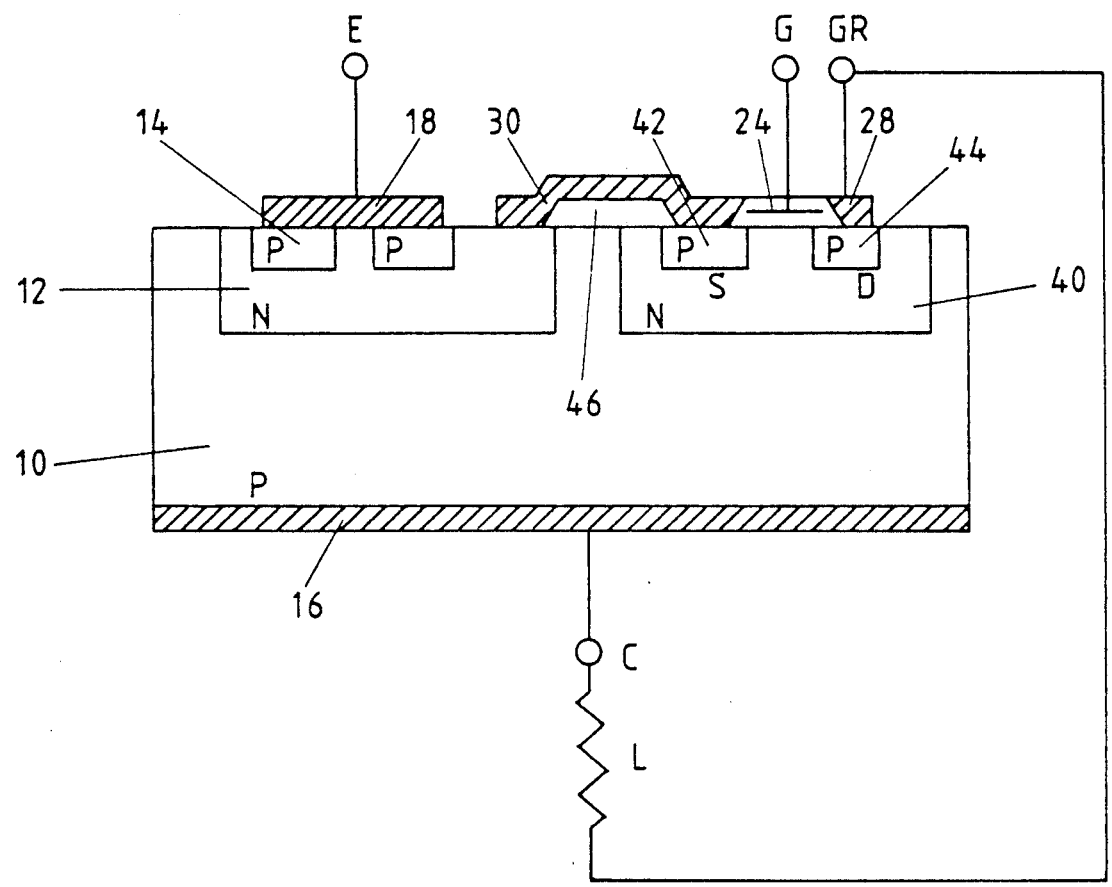
FIG. 11 is a diagrammatic section through a yet further embodiment of semiconductor power switching device in accordance with this invention.

FIG. 11 shows yet a further embodiment of semiconductor power switching device with a pnp bipolar transistor and having an n-type region 40 diffused into the substrate 10 at the top surface of the device, adjacent but separated from the base region 12. Two p-type regions 42, 44 (source and drain) are diffused into the region 40 and the insulated gate electrode 24 overlies the portion of region 40 which lies between the regions 42, 44. The fourth terminal GR is connected to the drain region 44 via an electrode 28 and metallization 30 extends over the surface of the device from the source region 42 to the base region 12, but is insulated at 46 from the collector region 10. The arrangement protects the device in the event that the emitter terminal E is inadvertently connected to a −ve supply and the fourth terminal connected to a +ve supply, which in the device of FIG. 1 could reverse bias the base-emitter junction excessively.

A further modificaton is shown in FIG. 11, which is applicable to all of the previously described embodiments. Thus, a central portion of the base region 12 extends to the emitter electrode 18. This deliberate short circuit takes full load current from the collector terminal should the supply be connected with incorrect polarity, the load L then limiting the current flow.

The device shown in FIG. 11 may be formed of the complementary conductivity type to that shown.

What is claimed is:

1. A semiconductor power switching device for switching power from a supply rail to a load, said drive comprising:

a body of semiconductor material having a surface and a collector region of a first conductivity type;

an emitter region of the first conductivity type on said body;

a base region of a second conductivity type disposed on said body between the emitter and collector regions, said base region having a portion extending to said surface;

a first terminal connected to the collector region;

a second terminal connected to the emitter region;

means defining two further regions in said base region;

an insulated gate, overlying said portion of the base region, for establishing charge carrier flow between said two further regions;

a gate terminal connected to the insulated gate;

a fourth terminal connected to one of said further regions; and a conductive path connecting the other of said further regions to said base region.

2. A semiconductor power switching device as claimed in claim 1, wherein said conductive path comprises a conductor on said surface connecting the other of said further regions to said base region.

3. A semiconductor power switching device as claimed in claim 1, wherein said base region has a portion which extends to said second terminal.

4. A semiconductor power switching device as claimed in claim 1, wherein said load is connected between said first terminal and said supply rail and said fourth terminal is also connected to said supply rail.

5. A semiconductor power switching device for switching power from a supply rail to a load, said device comprising:

a body of semiconductor material having a surface and a collector region of a first conductivity type, said collector region having a portion extending to said surface;

an emitter region of the first conductivity type on said body;

a base region of a second conductivity type disposed on said body between the emitter and collector regions, said base region having a portion extending to said surface;

a first terminal connected to the collector region;

a second terminal connected to the emitter region;

a further region formed in the base region;

an insulated gate, overlying said portion of the base region, for establishing charge carrier flow between said collector region and said further region;

a gate terminal connected to the insulated gate;

a fourth terminal connected to said collector region adjacent said insulated gate; and a conductive path connecting said further region to said base region.

6. A semiconductor power switching device as claimed in claim 5, wherein said conductive path comprises a conductor connecting said further region to said base region.

7. A semiconductor power switching as claimed in claim 5, wherein said base region has a portion which extends to said second terminal.

8. A semiconductor power switching device as claimed in claim 5, wherein said load is connected between said first terminal and said supply rail and said fourth terminal is also connected to said supply rail.

9. A semiconductor power switching device for switching power from a supply rail to a load, said device comprising:

a body of semiconductor material having a surface and a collector region of a first conductivity type;

an emitter region of the first conductivity type on said body;

a base region of a second conductivity type disposed on said body between the emitter and collector regions;

a second region of the second conductivity type separated from said base region;

a first terminal connected to the collector region;

a second terminal connected to the emitter region;

two further regions formed in said second region;

an insulated gate, overlying said second region for establishing charge carrier flow between said two further regions;

a gate terminal connected to the insulated gate;

a fourth terminal connected to one of said further regions, and a conductive path connecting the other said further region to said base region.

10. A semiconductor power switching device as claimed in claim 9, wherein said conductive path comprises a conductor connecting the other of said further regions to said base region.

11. A semiconductor power switching device as claimed in claim 9, wherein said base region has a portion which extends to said second terminal.

12. A semiconductor power switching device as claimed in claim 9 wherein said load is connected between said first terminal and said supply rail and said fourth terminal also connected to said supply rail.

* * * * *